(12) United States Patent
Campbell

(10) Patent No.: US 6,639,726 B1
(45) Date of Patent: Oct. 28, 2003

(54) MICROLENSES WITH SPACING ELEMENTS TO INCREASE AN EFFECTIVE USE OF SUBSTRATE

(75) Inventor: Scott Patrick Campbell, Thousand Oaks, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/859,224

(22) Filed: May 15, 2001

Related U.S. Application Data

(60) Provisional application No. 60/204,618, filed on May 16, 2000.

(51) Int. Cl.[7] .......................... G02B 27/10; G06K 9/20
(52) U.S. Cl. ....................................... 359/619; 382/317
(58) Field of Search ........................... 359/619; 382/317, 382/318, 321

(56) References Cited

U.S. PATENT DOCUMENTS 4,708,436 A * 11/1987 Kleinknecht ................ 359/575
5,956,163 A * 9/1999 Clarke et al. ............... 358/509

* cited by examiner

*Primary Examiner*—Ricky Mack
(74) *Attorney, Agent, or Firm*—Dickstein Shapiro Morin & Oshinsky LLP

(57) ABSTRACT

A system of changing lensing effect of microlenses on a substrate, by forming indentations in the substrate, which effect the microlenses, by either carrying out a lensing effect, or by changing the shape of the eventual microlens.

25 Claims, 3 Drawing Sheets

MICROLENSES WITH SPACING ELEMENTS TO INCREASE AN EFFECTIVE USE OF SUBSTRATE

CROSS REFERENCE TO RELATED APPLICATIONS

This application claims the benefit of the U.S. Provisional Application No. 60/204,618 filed May 16, 2000.

BACKGROUND

Image sensors often suffer a trade-off between the size of the image sensor and the number of items that can be placed on the image sensor. For example, larger sensor parts may be used to acquire more light, or to allow more control structure to be placed on the sensor substrate. It is often desirable to maximize the amount of circuitry that can be placed on a sensor.

Microlenses may often be placed on image sensor pixels. A conventional sensor may have the structure shown in FIG. 1. A planarization layer 100 covers the pixels 105, which may be image sensor pixels. Each microlens 110 is separated from an adjacent microlens 120 by a gap 112. The gap needs to have a specified size, e.g. one "design rule" wide. The presence of the gap may reduce the effective fill factor of the image sensor. These gaps between the lenses may be necessary to shape the lenses into their lens-like shape during the lens fabrication process. However, these gaps may lose certain real estate on the image sensor, and hence may affect the "fill factor".

SUMMARY

The present application teaches a way of forming spacing elements between gaps between lenses in an image sensor device. By doing this, the spacing between elements may be reduced.

BRIEF DESCRIPTION OF THE DRAWINGS

These and other aspects of the invention will be described in detail with reference to the accompanying drawings, wherein.

DETAILED DESCRIPTION

Figure 1:
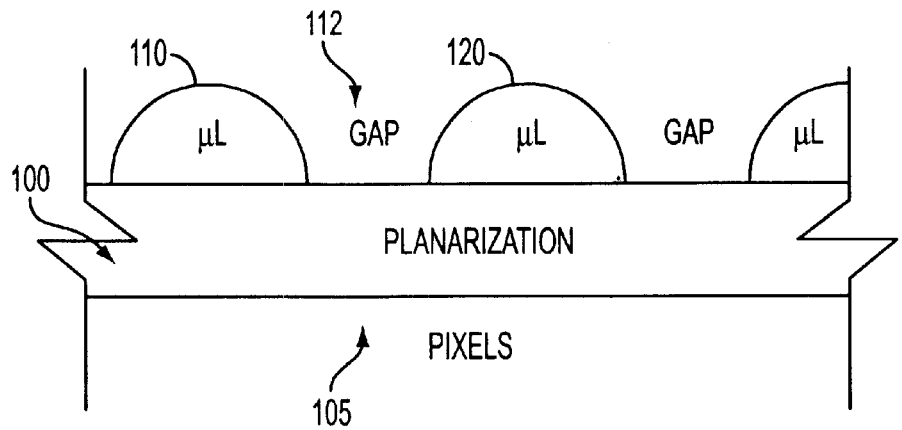
FIG. 1 shows conventional micro lenses, with a gap therebetween.
Figure 2:
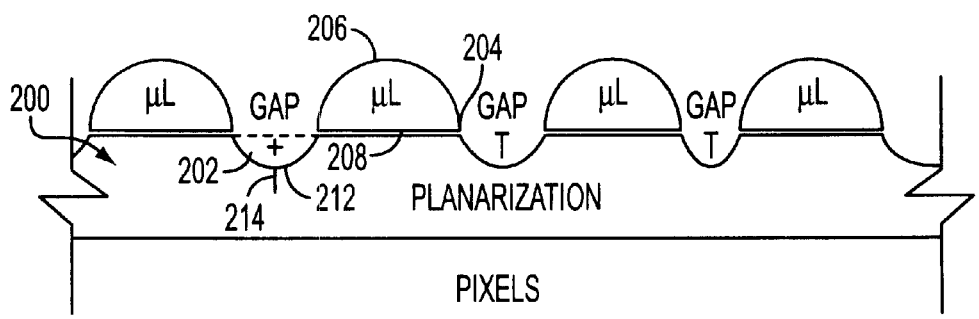
FIG. 2 shows a specific view of the microlenses of the present specification.

FIG. 2 shows an embodiment. The FIG. 2 view shows a cross-section across the image sensor with microlenses formed thereon. The surface on which the microlenses are formed is referred to herein as a planarization layer 200.

The planarization layer is first etched to form a gap area 202 which will end up being between two adjacent microlenses. The gap area is shaped in a way that provides it with a lensing effect.

The planarization layer is formed over the circuitry of the image sensor to even out the height of the top surface. The top surface of the planarization layer is usually flat. Here, instead, the top surface 204 is partially flat, but only in the area where the mircrolenses will be formed. The top surface forms a dip area 202 between those microlenses. The flat areas 204 are formed with microlenses 206 covering the flat area. As conventional, the bottom surfaces 208 of the microlenses abut against the flat surface 204.

Figure 3:
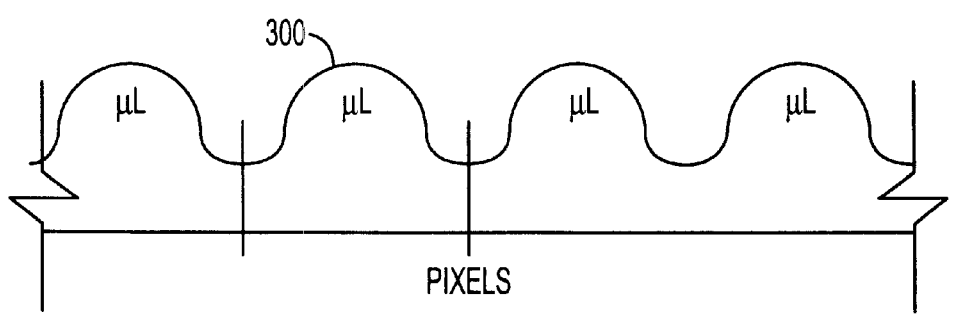
FIG. 3 shows an effective view of the micro lenses of the present specification.

In the embodiment shown in FIG. 2, the flat area 204 is substantially the same size as the bottom surface of the micro lens 206. The flat bottom surface of the microlens 206 forms a continuous surface with the portion of the substrate 212 to the center line 214 of the gap. Accordingly, the system effectively forms larger sized microlenses, at least part of which is formed from substrate material, as shown in FIG. 3. Each microlens, such as 300, has a continuous portion which includes the microlens portion, and the substrate portion 212 on both sides of the microlens portions. This avoids the necessity for gaps between the microlenses, thereby forming a higher fill factor.

The areas between the microlenses are "troughs", i.e., indentations in the substrate. The troughs may be of any desired shape that can cause a lensing effect for incoming light. That desired shape is preferably slightly curved, but can be of any shape that causes a lensing effect for light.

The troughs between the microlens may be flat and substantially triangular shaped, or may be in substantially the shape of the intersection of two spheres. The first sphere part would be 212, with the second sphere part being a continuation of the spherical shape from the other adjacent microlens.

Figure 4:
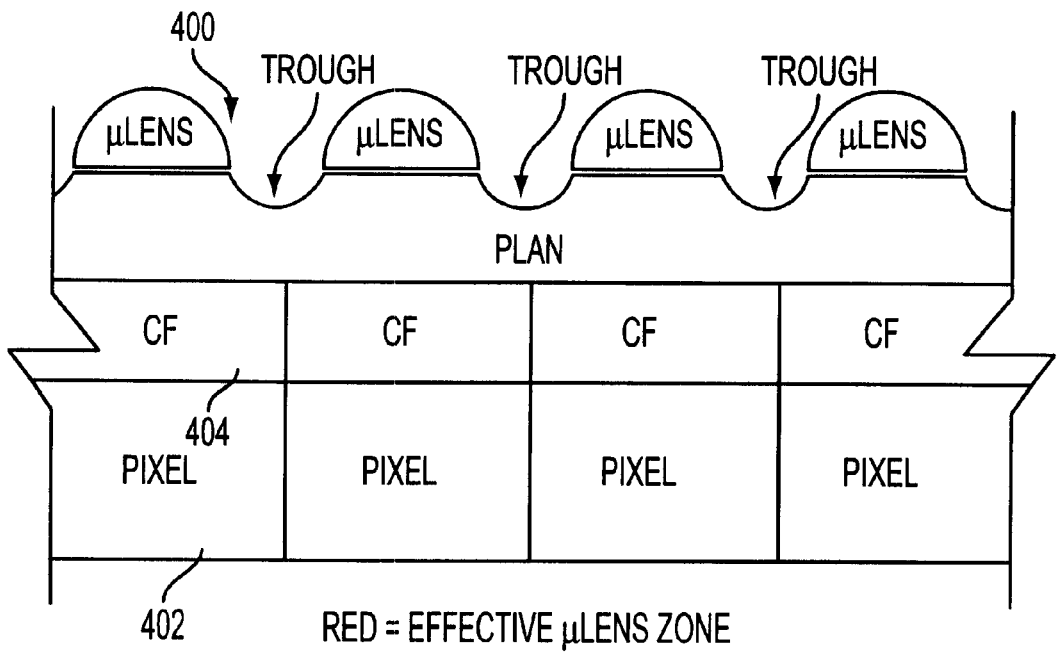
FIG. 4 shows a view with troughs between microlenses, relative to the pixels.

The troughs are shown in more detail in FIG. 4. Trough 400 has a lowest portion which is preferably aligned with edges between the image sensor pixels 402, which are also covered by color filters 404. Accordingly, the troughs between the microlenses may act to deflect light from regions between the pixels, into one of the pixel areas.

Figure 5:
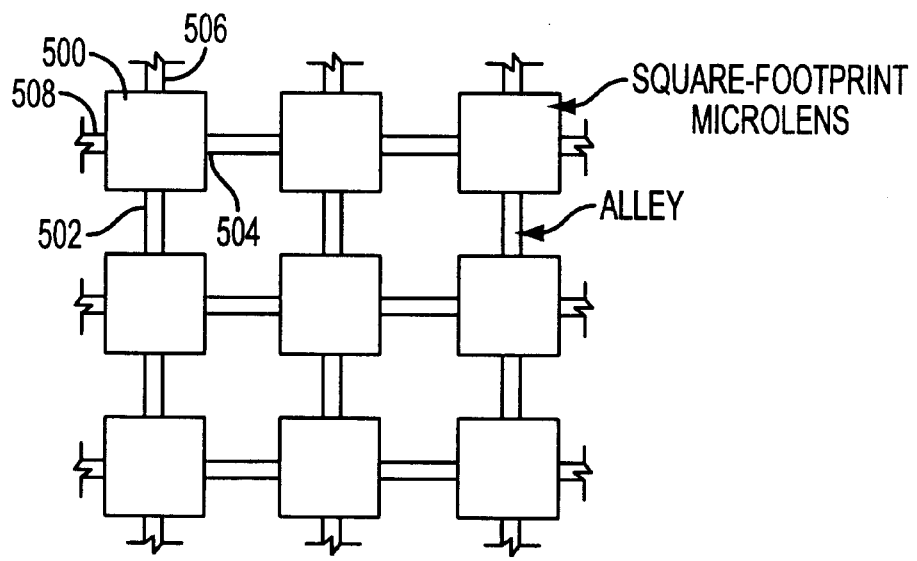
FIG. 5 shows a second embodiment with alleys between square microlenses.

Another embodiment shown in FIG. 5 is intended for use with a square outer shaped microlens. These square microlenses often have the same problems noted above of lower fill factors and relatively poor optical qualities. In a conventional square-footprint microlens, the surface profile after formation is somewhat pyramid shaped. The inventor believes that this pyramid shape is due to the way that the microlenses are formed. The microlens is formed by starting with a square microlens, then melting and reflowing. As the microlens melt re-flow cools, the free energy in the surface tension is reduced. This may tend to form non-regular structures. Such a structure profile does not necessarily make a good lens.

The present embodiment changes the surface profile by making the microlens more close to spherical. The system described herein uses indentations in the surface on which the microlenses are formed. These indentations are referred to as "alleys". The alleys are formed between the square footprint microlenses.

FIG. 5 shows an embodiment. The FIG. 5 system shows the top before melting. A square footprint microlens 500 is surrounded at four edges by alleys 502, 504, 506, 500. The alleys are indentations in the substrate on which the lenses are formed. The microlenses are heated to form liquid microlenses. The alleys alter the free energy state of these liquid lenses microlenses, and cause the resulting surface profile to become closer to spherical. In fact, for a system formed by four alleys around a square microlens, the resulting microlens, after melting and cooling, becomes a biaxial octagon.

Figure 6:
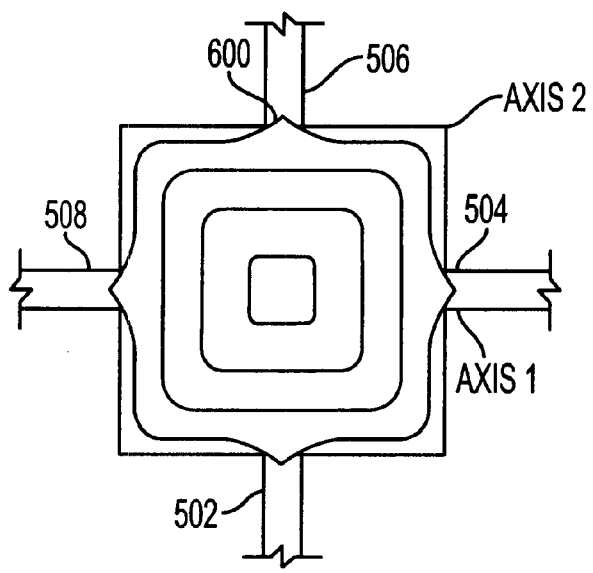
FIG. 6 shows a top view of the re-forming of the microlens.
Figure 7:
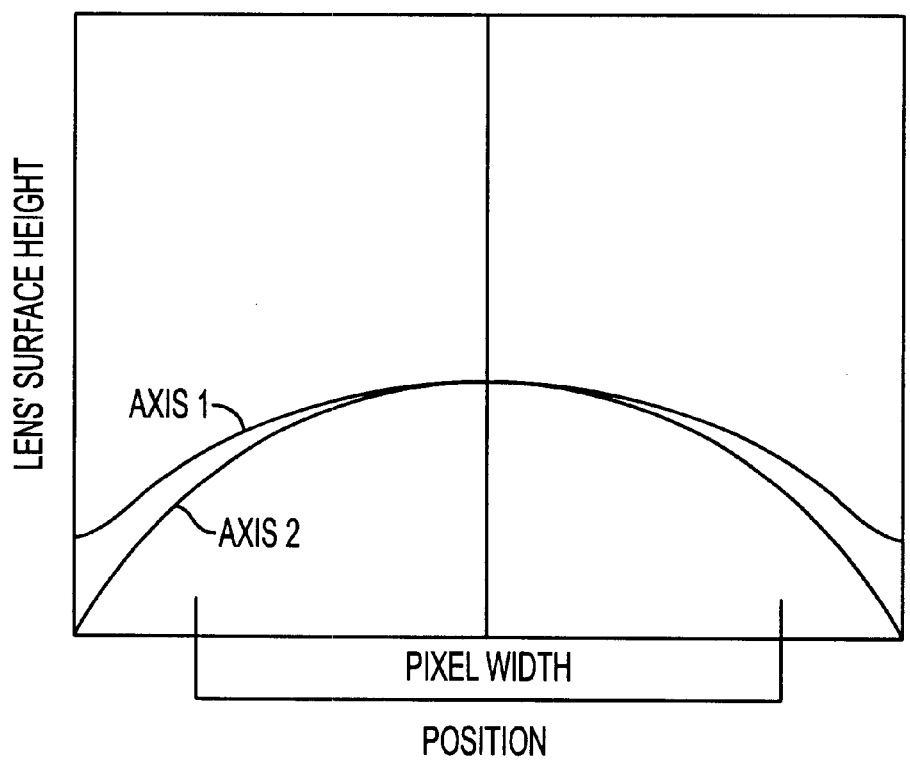
FIG. 7 shows the changing of the lens height based on width.

The alleys are formed along an axis as shown in FIG. 6. The alleys 504, 508 are formed along axis 1. The alleys 506, 502 are formed along axis 2. The alleys adjust the surface height of the microlenses as shown in the graph of FIG. 7. During the melt, the areas of the lens such as 600, which are nearest the alleys, are drawn at least slightly towards the alleys. Accordingly, the area 600 is drawn towards the alleys 506, thereby making that area more close to spherical.

While the above has been described using four alleys, one surrounding each microlens, it should be understood that more alleys could be used, and that the alleys need not be symmetrical. An asymmetrical system may be used, for example, where the optical effect of part of the microlens is more important than the effect of some other part of the microlens.

In addition, the same ideas can be used for other shaped microlenses including round microlenses in order to alter the shape of the microlenses.

All such modifications are intended to be encompassed within the following claims, into which:

What is claimed is:

1. A system, comprising:
   an image sensor structure, having a plurality of image sensing pixels in a substrate; and
   a layer provided over said plurality of image sensing pixels, said layer having a top surface with a plurality of indentations, each indentation defining an area surrounding one of said pixels.

2. A system as in claim 1, wherein said indentations are in the shape of rectangular troughs.

3. A system as in claim 1, wherein said indentations are of a shape which provides a lensing effect to incoming light.

4. A system as in claim 3, wherein said pixel is substantially centered between said indentations.

5. A system as in claim 1, further comprising a microlens, formed on a flat portion of said layer.

6. A system, comprising:
   an image sensor structure, having a plurality of image sensing pixels in a substrate; and
   a layer provided over said plurality of image sensing pixels, said layer having a top surface with a plurality of indentations therein at areas surrounding said pixels, wherein said indentations are troughs that are roughly in the shape of an intersection of two spheres.

7. A system, comprising:
   an image sensor structure, having a plurality of image sensing pixels in a substrate; and
   a layer provided over said plurality of image sensing pixels, said layer having a top surface with a plurality of indentations therein at areas surrounding said pixels wherein said indentations are of a shape which provides a lensing effect to incoming light, wherein said indentations have portions which are substantially round in cross section.

8. A system, comprising:
   an image sensor structure, having a plurality of image sensing pixels in a substrate; and
   a layer provided over said plurality of image sensing pixels, said layer having a top surface with a plurality of indentations, each indentation defining an area surrounding one of said pixels further comprising a microlens, formed on a flat portion of said layer, wherein said microlens has an outer shape which is substantially continuous with a shape of said indentations.

9. A system comprising:
   an image sensor structure, having a plurality of image sensing pixels in a substrate; and
   a layer provided over said plurality of image sensing pixels, said layer having a top surface with a plurality of indentations, each indentation defining an area surrounding one of said pixels further comprising a microlens, formed on a flat portion of said layer, wherein said indentations have a substantially lowest portion at an intersection between adjacent pixels.

10. A system, comprising:
    an image sensor structure, having a plurality of image sensing pixels in a substrate; and
    a layer provided over said plurality of image sensing pixels, said layer having a top surface with a plurality of indentations, each indentation defining an area surrounding one of said pixels, wherein said indentations are at locations to affect a shape of the microlens during melting.

11. An image sensor, comprising:
    a plurality of pixels, each said pixel including a light sensitive structure, formed in the semiconductor substrate;
    a layer provided over said pixels, and including a top surface, said top surface including flat portions, and indentations portions between said flat portions; and
    a plurality of microlenses, respectively formed on said flat portions, and each microlens being adjacent to at least one indentations portion.

12. A sensor as in claim 11, wherein said indentations are troughs having a shape which causes a lensing effect.

13. A sensor as in claim 12, wherein said troughs have a shape which is substantially in the shape of an intersection of two spheres.

14. A sensor as in claim 12, wherein said troughs have a substantially V shaped cross-section.

15. A sensor as in claim 11, wherein each of said pixels is centered underneath a respective indentation portion.

16. A sensor as in claim 11, wherein said layer is a planarization layer covering said plurality of pixels.

17. An image sensor, comprising:
    a plurality of pixels, each said pixel including a light sensitive structure, formed in a semiconductor substrate;
    a layer provided over more than one of said pixels, and including a top surface, said top surface including flat portions, and indentation portions between said flat portions; and
    a plurality of microlenses, respectively formed on said flat portions, and each microlens being adjacent to at least one indentation portion, wherein said indentations are troughs with a shape that affects a melting of the microlenses during a formation process.

18. An image sensor, comprising:
    a plurality of pixels, each said pixel including a light sensitive structure, formed in a semiconductor substrate;
    a layer provided over more than one said pixels, and including a top surface, said top surface including a flat portion, and indentation portions between said flat portions; and
    a plurality of microlenses, respectively formed on said flat portions, and each microlens being adjacent to at least one indentation portion, wherein said indentation portions have a substantially lowest portion in the substrate at a midpoint between adjacent pixels.

19. An image sensor, comprising:
a plurality of pixels, each said pixel including a light-sensitive structure, formed in this semiconductor substrate;
a covering layer, covering said pixels, and including a top surface, said top surface including flat portions, and indentation portions between said flat portions; and
a plurality of microlenses, respectively formed on said flat portions, and each microlens being adjacent at least one indentation portion, wherein said indentations have a substantially lowest spot on the substrate at a midpoint between adjacent pixels.

20. A method, comprising:
forming an image sensor with a plurality of light-sensitive pixels;
covering more than one of said plurality of light sensitive pixels with a layer; and
shaping said layer in a way to effect a lensing operation.

21. A method as in claim 20, wherein said shaping comprises shaping the substrate to carry out a lensing effect.

22. A method as in claim 20, wherein said shaping comprises shaping the substrate to effect a formation of an overlying microlens.

23. A method as in claim 20, wherein said shaping comprises forming at least one indentation on said layer.

24. A method as in claim 23, wherein said indentations are in a shape that carries out a lensing effect.

25. A method as in claim 20, wherein said layer has a first portion with a microlens formed thereon, said first portion adjacent to said portion of said layer which carries out the lensing operation; and
using at least a portion of said layer for a lensing effect.

* * * * *